(12) United States Patent
Freisleben et al.

(10) Patent No.: US 7,076,404 B2
(45) Date of Patent: Jul. 11, 2006

(54) METHOD AND APPARATUS FOR THE ANALYSIS AND MONITORING OF THE PARTIAL DISCHARGE BEHAVIOR OF AN ELECTRICAL OPERATING DEVICE

(75) Inventors: Bernd Freisleben, Bad Vilbel (DE); Martin Hoof, Kaiserslautern (DE); Alban Kulla, Marburg (DE); Eniana Mustafaraj, Marburg (DE); Michael Peters, Kuessaberg (DE); Christoph Wendel, Laufenburg (DE)

(73) Assignee: ALSTOM Technology Ltd., Baden (CH)

( * ) Notice: Subject to any disclaimer, the term of this patent is extended or adjusted under 35 U.S.C. 154(b) by 1 day.

(21) Appl. No.: 10/757,566

(22) Filed: Jan. 15, 2004

(65) Prior Publication Data

US 2004/0204873 A1    Oct. 14, 2004

(30) Foreign Application Priority Data

Jan. 15, 2003    (CH) .................................. 0057/03

(51) Int. Cl.
*G06F 7/38*    (2006.01)
(52) U.S. Cl. ...................... 702/196; 702/179; 702/182; 702/183
(58) Field of Classification Search ............ 702/57–59, 702/81, 82, 179, 182, 196, 183; 324/536; 174/168
See application file for complete search history.

(56) References Cited

U.S. PATENT DOCUMENTS 6,088,658 A    7/2000  Yazici et al. .................. 702/58
6,192,317 B1*  2/2001  Yazici et al. .................. 702/58
6,448,782 B1*  9/2002  Pakonen et al. ............. 324/536
6,759,595 B1*  7/2004  Goehlich et al. ............ 174/168

FOREIGN PATENT DOCUMENTS

EP    1 094 325 A2    4/2001
GB    2 368 733 A     5/2002

OTHER PUBLICATIONS

Hozumi, N. et al., "Time-lag Measurement of Void Discharges for the Clarification of the Factor for Partial Discharge Pattern", 2000 IEEE Conference on Electrical Insulation and Dielectric Phenomena.

(Continued)

*Primary Examiner*—Marc S. Hoff
*Assistant Examiner*—Felix Suarez
(74) *Attorney, Agent, or Firm*—Cermak & Kenealy, LLP; Adan J. Cermak

(57) ABSTRACT

A description is given of a method for the analysis and/or monitoring of the partial discharge behavior of an electrical operating means, in particular in terms of its development over time. Here, appropriate partial discharge data is recorded in process state matrices (2, 3), in which, in each case in a matrix element (5) of the process state matrix (1), the amplitude (7) of a partial discharge, its phase angle (6) and its frequency of occurrence is depicted (in particular what is known as a PRPD representation). A simplified analysis is made possible by the fact that, at a first time, a partial discharge process state is registered in a first process state matrix (2) and, at a later time, a further partial discharge process state is registered in a further process state matrix (3). Then, for the purpose of analysis and/or monitoring, the first (2) and the second (3) process state matrix are compared with the aid of comparison and scaling methods.

22 Claims, 7 Drawing Sheets

OTHER PUBLICATIONS

Petkovic, I. et al., "Measuring System for Partial Discharge", IEEE Instrumentation and Measurement Technology Conference, Brussels, Belgium Jun. 4-6, 1996.

Search Report from EP 04 10 0074 (Dec. 2, 2004).
Search Report from CH 2003 0057/03 (Jun. 2, 2003).

* cited by examiner

METHOD AND APPARATUS FOR THE ANALYSIS AND MONITORING OF THE PARTIAL DISCHARGE BEHAVIOR OF AN ELECTRICAL OPERATING DEVICE

BACKGROUND OF THE INVENTION

1. Field of the Invention

The present invention relates to the field of the methods for the analysis and/or monitoring of the partial discharge behavior of an electrical operating means, in particular in terms of its development over time.

2. Discussion of Background

Partial discharges (TE) designate those electrical discharge phenomena which do not lead to the breakdown of the entire insulation section. They are propagated only in a spatially limited region.

Partial discharges always take place within a gas chamber or else at interfaces between a gas chamber and other surfaces. They can also occur in solid insulation as a consequence of highly inhomogeneous field conditions. However, they generally occur far above the technical limits of the use of the insulating materials, and are therefore generally not relevant to the normal operating case.

Partial discharges form as a consequence of inhomogeneous field conditions, for example on account of different dielectric constants of the insulating materials, and the possible local overloading of individual sections of the insulating material which result from this.

Such partial discharges always lead to damage to the installation surrounding them. On the other hand, the extent to which this damage leads to significant aging of the surrounding medium depends on a large number of parameters.

For example, the partial discharges can be of such low energy in terms of intensity that the degree of damage, measured over technically relevant time periods, can be disregarded. Likewise, the surrounding medium (insulating material) can be resistant to partial discharges in such a way that the damaging effect, within relevant time periods, can likewise be disregarded, even given an increased partial discharge intensity.

Likewise, the insulating material can be composed in such a way that damaged "portions" are led away from the location of the discharge activity, for example by means of natural convection. This is possible in the case of circulating air as insulating material or else in the case of circulating liquids, and is also used technically there.

The detection of such discharges can be carried out in various ways, such as by means of optical and electromagnetic detection processes or else by means of acoustic processes. In order to detect partial discharges within spatially extended arrangements, the electrical detection of these discharges by means of measuring the partial discharge current has become widespread. Enclosed insulating material portions can be monitored sufficiently reliably only by means of measurements of the electrical signals.

Measuring instruments for detecting such phenomena are widespread. They are capable of recording the partial discharge activity over a specific time period and displaying it. Likewise, such instruments are capable of carrying out measurements upon request or periodic measurements independently in the event that remote control ability is implemented. Measurements are also frequently carried out periodically, by a transportable partial discharge measuring instrument being connected at regular time intervals to the object to be measured.

The feature common to these methods is frequently that the measurements can generally be carried out only at relatively long time intervals, for example every six months, because of the large amounts of data which accumulate. In addition, such measurements are frequently carried out on site by specifically trained personnel, so that the repeated measurements cannot be carried out too frequently either for reasons of cost.

However, it is also important that very many partial discharge processes develop relatively slowly, so that repeated measurements often cannot be justified in every case.

The disadvantages with periodic measurements are:
1. Rapid changes in the partial discharge behavior are consequently not detected. Thus, this information, which may be important under certain circumstances, is not available.
2. Information relating to the partial discharge behavior is not available under all possible operating statements (load, temperature, vibration, . . . ). This is likewise equivalent to the loss of specific, to some extent important, information.
3. Measures based on changing partial discharge behavior are, under certain circumstances, introduced too late or else critical damage is detected too late.

A remedy is provided by systems which observe the partial discharge behavior continuously and
1. store the data in compressed form or detect and store it only over short intervals, or systems
2. which subject the currently measured partial discharge behavior to a superimposed process and, from this process, extract a few characteristic values which represent the partial discharge behavior adequately, in order then to store these characteristic values. These characteristic values can subsequently be used to initiate further actions.

Methods which subject the measured partial discharge behavior to a superimposed process are outlined in U.S. Pat. Nos. 6,088,658 and 6,192,317. These patents present a method which, in principle, operates in accordance with the following scheme:
1. A system is trained with a number of items of partial discharge data in order to form classes for known fault types.
2. The state of the electrical operating means, from which this partial discharge data has been collected, must be known.
3. In order to train the system, at least two data sets are needed: the partial discharge data of insulation damaged in any way, and also the partial discharge data relating to an operating means with sound insulation. With this data, at least two classes are formed; the state of damage must be known in each case.
4. Forming classes means:
   a) An insulation state is determined which is representative of the class and which represents this insulation state (class) on average, and
   b) Threshold values are defined, within which this class is representative.
5. Further partial discharge data is then supplied to the system in order to form further classes of known insulation states and in order once more to obtain threshold values relating to these. However, the system is in principle able to manage with only two classes.
6. In order to determine the state of an insulation with the aid of the partial discharge measurement, the spacing (distance) of the current partial discharge measurement is obtained with the representative partial discharge measurement (representative measurement) of each previously formed class.

7. Following the comparison of these calculated distances with the associated threshold values, the current measurement is allocated to the class whose spacing from the representative measurement is the lowest, if the spacing from the class lies within the threshold value. Otherwise, the current measurement counts as invalid or not to be allocated.

Methods which use these or similar approaches are identified by the following characteristics:

1. The classes must have been formed with a number of items of known partial discharge data before reliable output values can be expected. This number of items of representative data is important in particular in order to define the thresholds within which the classes are detected. This is also important if the partial discharge data is superimposed, for example by interfering data and noise, which in each case make the formation of classes more difficult.
2. Only insulation states which have previously been trained for the class formation are detected.
3. If, during the training, the installation state was not taken into account correctly, then the output value from this process will always be affected by errors or allocated to the classes formed erroneously.
4. A comparison of the partial discharge behavior of different electrical operating means is not always possible if the peripherals of the operating means or the operating means themselves are not identical. The data base which is used to form the classes may therefore be thin or less reliable.
5. However, if the classes formed represent machines of different design and different peripherals, then access is automatically made to a very large data base, which improves the quality of the statements.
6. If sufficiently many fault types have been used to form various classes, then the fault types can also be detected in a differentiated manner.
7. The results obtained from the class formation and from the comparison with newly obtained partial discharge data can be used to document the partial discharge history of an electrical operating means and to make a future prognosis.

SUMMARY OF THE INVENTION

Accordingly, one object of the invention is to provide an improved method for the analysis and/or monitoring of the partial discharge behavior of an electrical operating means. In particular, it concerns monitoring the development over time of the partial discharge behavior. In the process, typically appropriate partial discharge data is recorded in process state matrices, in which in each case the amplitude of a partial discharge, its phase angle and its frequency of occurrence are depicted in a matrix element of the process state matrix. For example, by the amplitude being depicted as a function of the phase angle, each matrix element additionally being assigned an associated frequency of occurrence. This representation is normally designated a phase resolved partial discharge pattern, PRPD. Typically, data of this type is represented by the amplitude being plotted as a function of the phase angle and by a specific, encoding coloration or grey graduation being used for each data point as a form of encoding of the third dimension, the frequency of occurrence. Alternatively, it is possible, inter alia, to represent this data in space in such a way that a relief is formed (what is known as a waterfall representation), in which, for example, high frequencies of occurrence are represented by a point arranged high above a normal plane and correspondingly low frequencies low over the normal plane. In addition, representations in polar coordinates and others are possible.

As a solution, a method is presented in this disclosure which indicates a further approach to assessing the partial discharge behavior of an electrical operating means. This assessment is based on the comparison of the current state of an operating means with at least one state of the operating means known earlier and assessed by a human expert, which is described numerically by one (or more) initial state parameter. The data produced by the comparison can likewise be used for trending a partial discharge behavior.

The significant difference from the method described previously is that use is made only of the partial discharge behavior of the electrical operating means considered, in order to assess the state of its insulation. This method is therefore not dependent on the formation of classes in order to assess the state but is based substantially on the experience of human experts in assessing the state of the insulation at the start of the observation period and at every further observation time.

The statements are therefore primarily not based on the detection of the specific fault sources but are substantially restricted to the detection of substantial changes in the partial discharge behavior.

In concrete terms, the present solution is based on registering, at a first time, a partial discharge process state in a first process state matrix and, at a later time, of registering a further partial discharge process state in a further process state matrix. Then, for the purpose of analysis and/or monitoring, the first and second process state matrices are compared with the aid of comparison and scaling methods.

In principle, the partial discharge process state registered at the first time can be used as a basis for the comparison with all process states registered later. Alternatively, however, each partial discharge process state registered at an arbitrary time can be used as a basis for the comparison with all the process states registered later.

In particular in relation to simplified interpretation and fault localization, but also in relation to volumes of data to be stored, according to a first preferred embodiment, it proves to be advantageous firstly to determine state parameters, in particular scaled state parameters, from the process state matrices in each case and then, for the purpose of analysis and/or monitoring of the insulation states, to compare these state parameters or to correlate them with one another. In this case, these may be one or more state parameters. The variation over time of state parameters determined from various further process state matrices can additionally be used for the assessment of the change over time or for the prognosis of the supposed further change over time of the partial discharge behavior. The output value or values from the comparisons carried out between the state parameters can advantageously be used, amongst other things, to initiate repair and overhaul actions or to define these actions from the variation over time of the state parameters.

According to a further preferred embodiment of the invention, the individual matrix elements, depending on their amplitude, are subjected to different weighting and/or scaling before they are supplied to the comparison and scaling method. Alternatively or additionally, it is possible to use the phase angle and/or the frequency of occurrence instead of the amplitude as a basis for the weighting.

Another preferred embodiment is distinguished by the fact that the comparison method comprises a step in which similarity values are formed, which reproduce the difference between the process state matrices, the process state matrices being visualized in a representation of the amplitudes as a function of the phrase angle and of an encoding of each such pixel as a function of the frequency of occurrence (PRPD representation).

The comparisons between different process state matrices can be implemented particularly simply if, in the PRPD representation, the amplitude/phase plane is divided into windows, completely or partially, and subsequently this grid is in each case applied to some extent to the various process state matrices for evaluation. In this case, the windows can assume any desired shape and size and can be arranged beside one another or spaced apart. The matrix elements of individual windows are then treated in combined form, for example, if appropriate following prior averaging, and the individual, corresponding window contents arranged in various process state matrices are compared in weighted form. In practical terms, this means that, in the plane of the process state matrices covered by phase angles and amplitudes, in particular (but not necessarily) matrix elements arranged adjacently are combined in discrete windows, and that the matrix elements of a window are in each case averaged and/or scaled together before they are supplied to the comparison method. In this case, the procedure is preferably such that the contents of corresponding windows of different process state matrices are compared, and that the different windows in a process state matrix are, if appropriate, weighted and/or scaled differently.

Further improvement or rationalization of the comparison method can be implemented by means of an intelligent selection of regions of particular interest. In this case, the procedure is such that, in the plane of the process of state matrices covered by phase angles and amplitudes, matrix elements arranged adjacently in discrete regions of interest are in particular combined. Different discrete regions of interest are then preferably scaled and/or weighted differently. The regions of interest are then advantageously divided up into windows of any desired shape such that the windows in each case substantially cover the region of interest. In practical terms, the procedure is such that the discrete regions of interest are divided up into discrete windows, and that the contents of windows of similar regions, if appropriate following common averaging of the matrix elements of the respective window, are treated equally in the comparison method. It is also possible for the entire process state matrix to be defined as a single total region of interest.

In principle, an extremely wide range of state parameters can be calculated and defined. In addition, it is possible to link state changes obtained from the comparison of the state parameters obtained from regions of interest mathematically with one another, in order to obtain a desired number of state parameters. It is also possible to link state changes obtained from the comparisons of the state parameters obtained from regions of interest mathematically with at least one state parameter obtained from regions judged to be not of interest, in order to obtain a desired number of state parameters.

Further preferred embodiments of the method are described in the independent claims.

Any desired processes can be assessed with the aid of the same method, the variation over time of the processes being represented as described in the method, and it being possible for their process states likewise to be used to make a future prognosis or any desired actions to be initiated on their basis, if the process states can be described in an identical or in a similar manner as matrix elements.

In addition, the present invention relates to an apparatus for implementing the aforementioned method.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
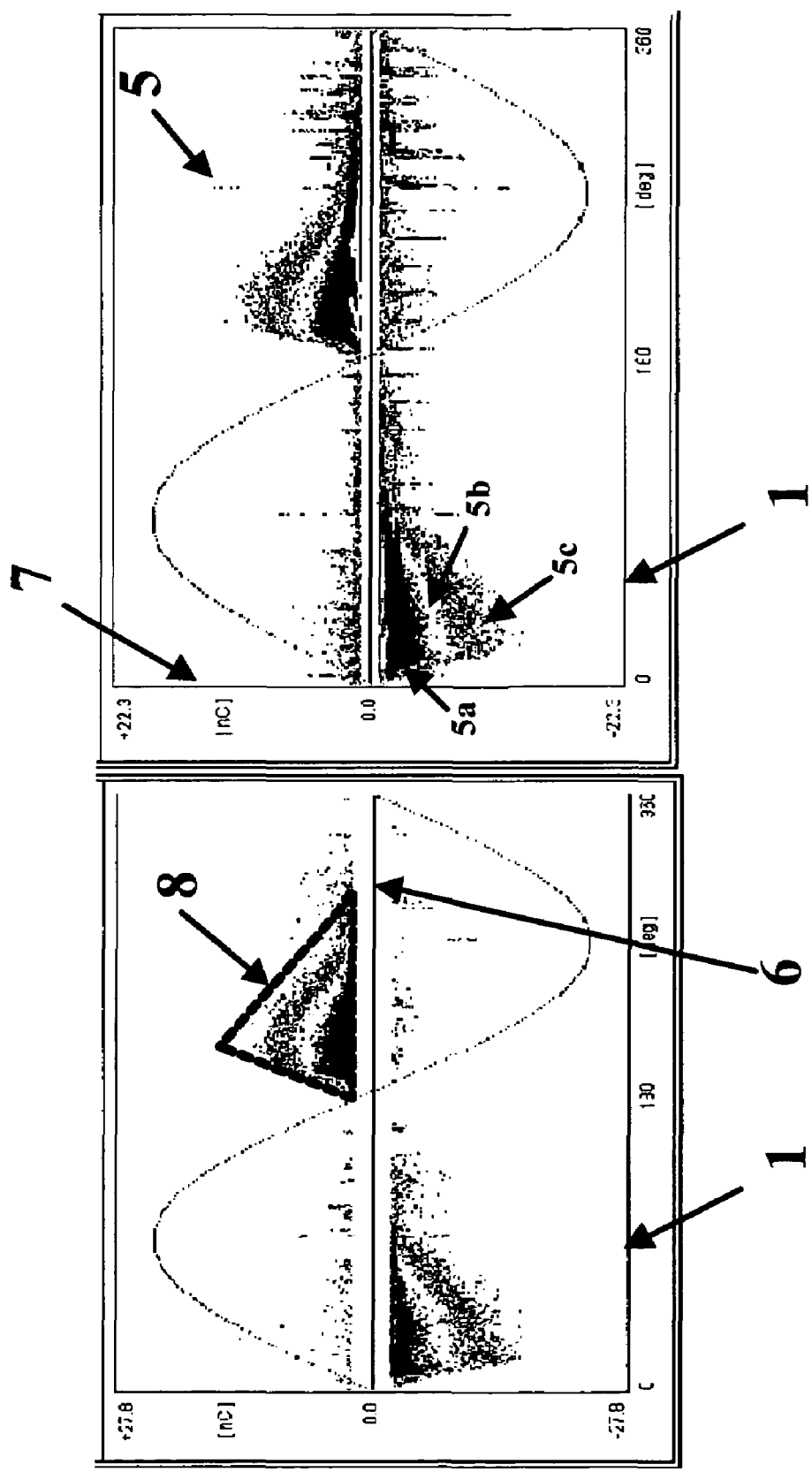
FIG. 1 shows the partial discharge behavior of an electrical operating means as a phase resolved partial discharge pattern (PRPD) at two different times, the assessed state on the left and a later state on the right.

Referring now to the drawings, wherein like reference numerals designate identical or corresponding parts throughout the several views, the invention relates to a method of establishing the development over time of discharge phenomena which, for example, are caused by gas inclusions within high-voltage insulation, or else of discharges on the surface of such insulation. These processes may be described, inter alia, in the form of patterns and images.

The detection of these so-called partial discharges (TE) is the currently most widespread possibility of registering the state of high voltage insulation even during operation. Accordingly, more and more importance is being assigned to the registration and the automatic assessment of partial discharge patterns and their change.

The invention described below is primarily employed to assess the state of insulation on the basis of assessing processes which are relevant to the partial discharge. However, following adaptation to the respective process, it likewise possesses validity for further areas of application.

FIG. 1 shows the partial discharge behavior of an electrical operating means as what is known as a phase resolved partial discharge pattern (PRPD pattern) 1, recorded at two different times 2 (as it were, assessed reference state) and 3 (state recorded later).

This representation of the partial discharge behavior as an image is established and is very frequently used to assess the state of insulation. For this purpose, in this representation, each partial discharge event is assigned a pixel or a matrix element 5. This is done in accordance with the following convention:

1. The phase angle at which the partial discharge has occurred forms the abscissa 6.
2. The partial discharge pulse amplitude (partial discharge intensity) is plotted on the ordinate 7.
3. The number of partial discharge events (frequency of occurrence) is depicted in colored encoded form in the coordinate system covered by the phase angle and by the pulse amplitude (matrix element, pixel 5).

Unfortunately, the colored encoding cannot be represented in the graphs illustrated below. Regions of different frequency of occurrence are, however, visualized experimentally by pixels placed differently closely. This is explained in the right-hand part of FIG. 1; the reference symbol 5a designates the highly blackened region, which represents a high frequency of occurrence. In a colored representation, a region of this type would be identified, for example, by the color yellow. A lighter region is identified by the reference symbol 5b; in this region, the individual matrix elements have an average frequency of occurrence, and in a colored representation, this region is encoded red, for example. In addition, the reference symbol 5c designates a further region whose matrix elements have a low frequency of occurrence. In a colored representation, this region could be encoded by the color violet, for example. They colored representation, which is unfortunately not possible in conjunction with the present description, permits a visualization of the data which is very intuitive and provided with smooth transitions, although it is unfortunately necessary to dispense with this here. However, since the aforementioned representation is a type of representation which is known in this technical field, it is possible for further explanations to be omitted.

It is thus possible to visualize this intrinsically three-dimensional data matrix two-dimensionally. From this two-dimensional representation, a human expert can:

1. Determine partial discharge sources by using certain shapes (typical patterns, illustrated by the reference number 8 in FIG. 1), which result in this picture.
2. Determine the influence of different loading parameters on the partial discharge behavior.
3. Detect changes on or within the insulating material by using a chronological sequence of recorded partial discharge measurements.
4. By using the possibilities described above, detect critical states and initiate further actions.

Since, as described in the preceding section "Prior Art", the partial discharge behavior depends both on the operating means itself and on the peripherals of the operating means, it is not always possible for the state of the insulation to be determined correctly merely on the basis of the above-described partial discharge pattern. Consequently, increased importance is attached to the determination of the change in the partial discharge behavior.

Figure 2:
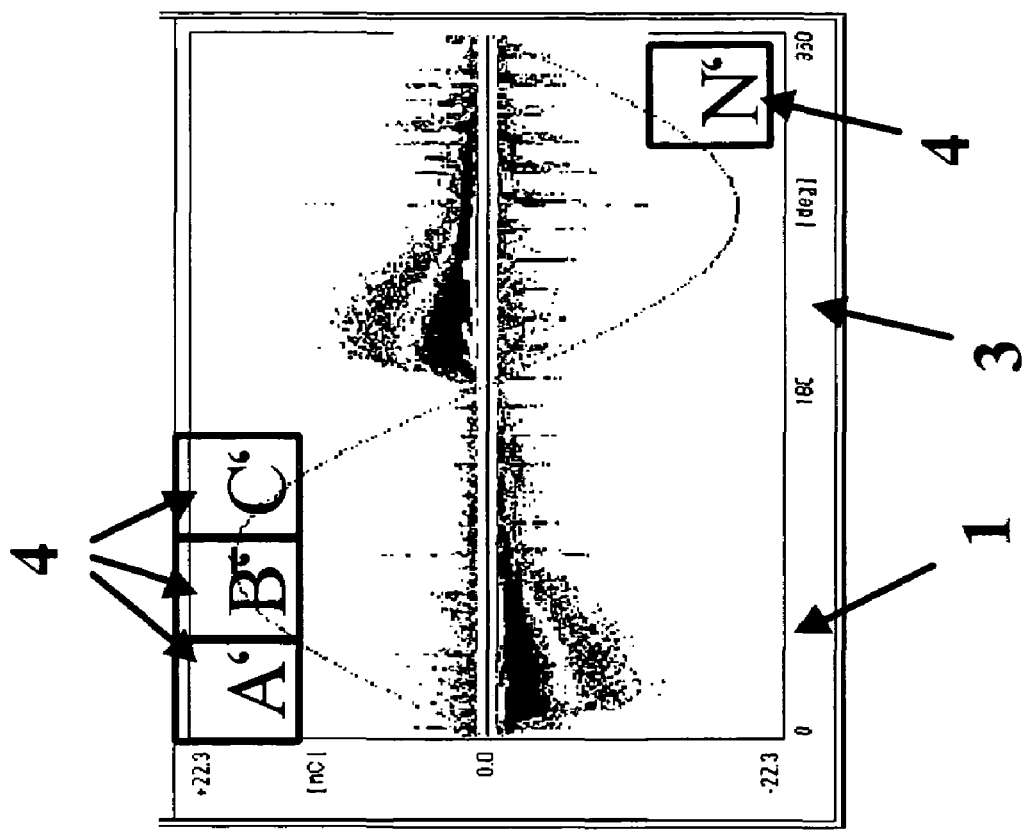
FIG. 2 shows a phase resolved partial discharge pattern according to FIG. 1, the two-dimensional planes being divided into corresponding windows.
Figure 2:
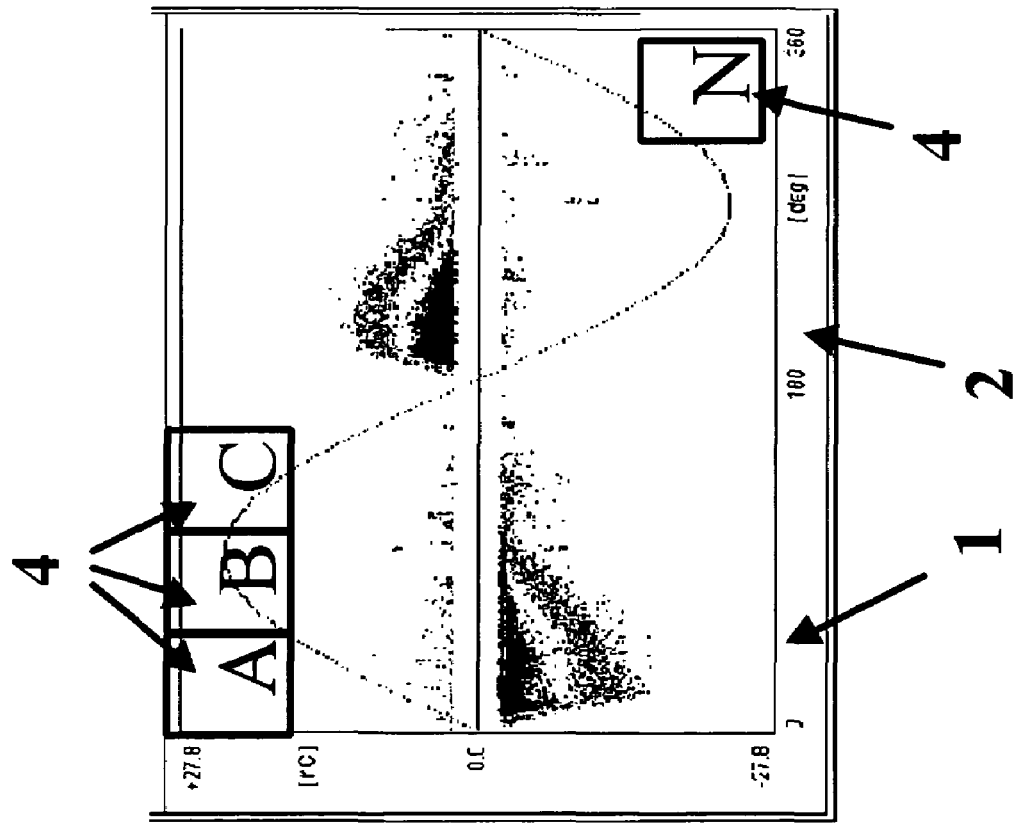

The present invention accordingly deals with the problem of assessing the current state 3 of the insulation of an electrical operating means. The assessment is based on the comparison of the current state 3 of the operating means with a state 2 of the operating means detected and assessed earlier. In FIGS. 1 and 2, by way of example, the earlier, known and assessed state 2 is illustrated on the left-hand side, and the later current state 3 on the right-hand side. In this case, the previous development over time (relative change) can also be used for prognoses of the state in the future.

Description of a first exemplary embodiment of the method using FIG. 2 for illustration:

1. The partial discharge behavior of an operating means is recorded at various times. In the example, 2 represents the behavior at the starting time and 3 at the current time.
2. The partial discharge behaviors visualized as a picture are compared (FIG. 2).
3. Both windows recorded at various times (FIG. 2) are subdivided into an equal number of windows (A, B, C, . . . , N; A', B', C', . . . , N').
4. In each of the windows, averaging and scaling of the pixels is carried out in order not to assess unimportant differences between the window contents in a dominant manner.
5. The image contents are compared window by window, in each case corresponding windows being compared (FIG. 2, window A with A', window B with B', window C with C', . . . , window N with N').
6. The comparison between the individual windows 4 therefore results in what are known as similarity values.
7. The similarity values of all the windows (FIG. 2; A, B, C, . . . , N; A', B', C', . . . , N') are combined to form an individual or a plurality of similarity values, representative of the entire image (FIG. 2; A, B, C, . . . , N; A', B', C', . . . , N').
8. The initial state parameter is correlated with the similarity value in order to form a current state parameter.
9. The development over time of the state parameters can be used, for example, to initiate overhaul work or to prognosticate the future development over time.

Figure 3A:
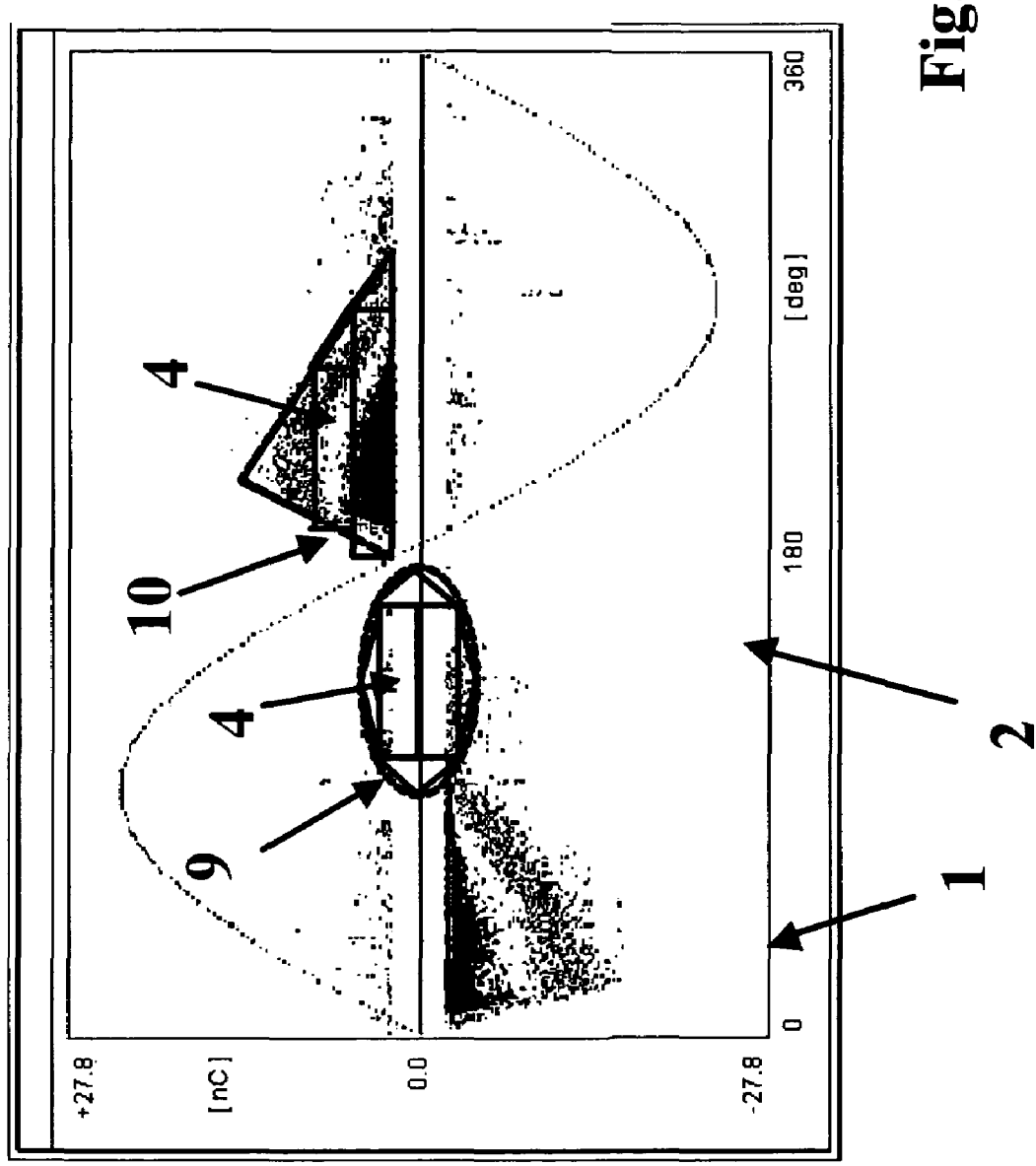
FIG. 3 a) shows a phase resolved partial discharge pattern according to FIG. 1, the assessed state on the left, two partial processes of interest being designated and divided into windows; b) as a), later time.
Figure 3B:
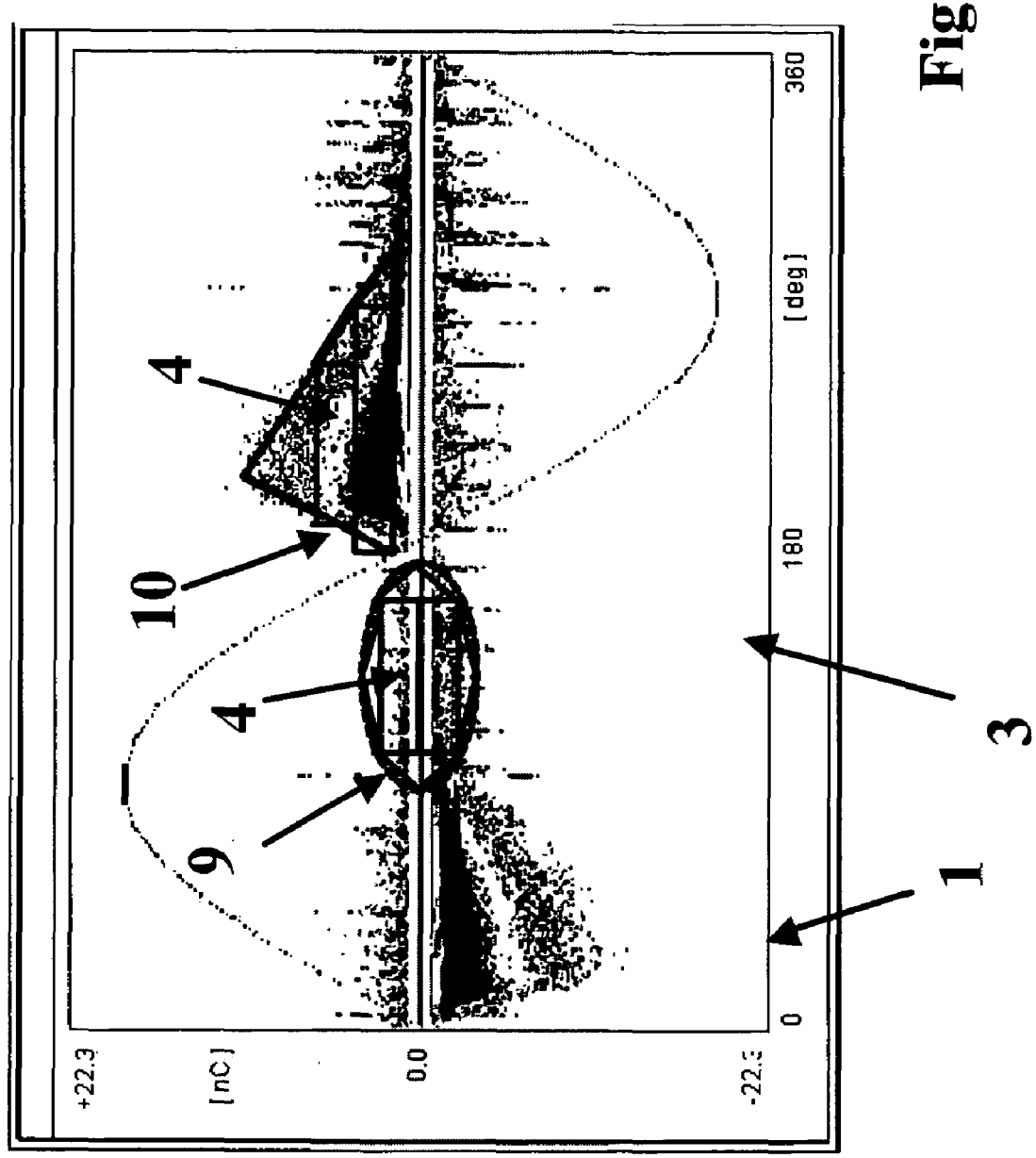

Description of a second exemplary embodiment of the method using FIG. 3 for illustration:

1. The partial discharge behavior of an operating means is recorded at various times. In the example, 2 represents the behavior at the starting time (FIG. 3a) and 3 at the current time (FIG. 3b).
2. In the picture 2 (FIG. 3a) which results from the first measurement, all those regions to which, in the following picture comparison, the specific comparison algorithm is to be applied (part processes 9, 10 of interest; what are known as ROIs="regions of interest", always abbreviated ROI in the further document) are marked. Ideally, these ROIs circumscribe patterns which, in turn, can represent partial discharge locations.
3. The number of marked ROIs can be as large as desired.
4. The partial discharge behaviors visualized as a picture are compared (FIGS. 3a and b).
5. The marked ROIs are subdivided into a number of windows 4, whose shapes/sizes can be selected as desired and which simulate the previously identified subregions 9 and 10 sufficiently well.
6. In each of the windows, averaging and scaling of the pixels is carried out in order not to assess unimportant differences between the window contents in a dominant manner.
7. The picture contents are compared window 4 by window 4, in each case corresponding windows within the marked subregions 9, 10 being compared.
8. The comparison between the individual windows 4 results in what are known as similarity values.

9. The similarity values of all windows 4 within the respective ROI 9, 10 are combined to form a single or a plurality of similarity values representative of the respective ROI 9 or 10. The combined values are called state parameters.
10. The state parameters obtained relating to the first partial discharge behavior determined at the first time 2 and the partial discharge behavior determined at the second time 3 are correlated with each other, which is designated a state change here.
11. The similarity value of marked windows 4 outside all the partial discharge behaviors determined at the first time 2 and at the second time 3 are likewise formed in order also to record the state changes outside the ROI 9, 10.
12. The state parameters of the state changes within the ROI and also likewise outside the ROI can be represented as a single numerical value or by a plurality of numerical values.
13. The development over time of the state changes can be used, for example, to initiate overhaul work or to prognosticate the future development over time.

Figure 4:
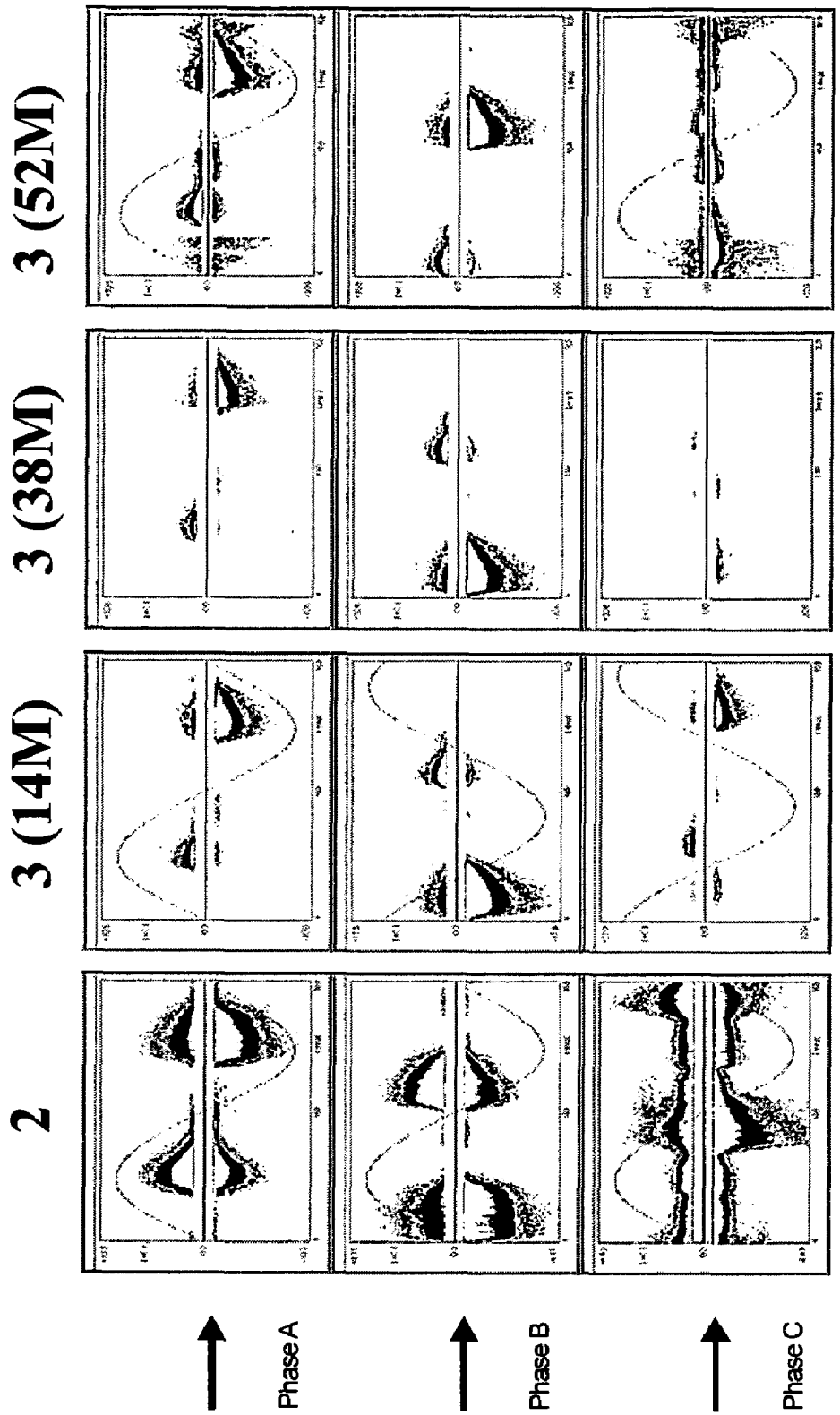
FIG. 4 shows a phase resolved partial discharge pattern according to FIG. 1, the three various phases of the electrical operating means being represented one above another and in each case three later times, after 14, 38 and 52 months, respectively, being illustrated.

FIG. 4 illustrates the development over time of the partial discharge behavior of a generator with the following operating data:

| | |
|---|---|
| Commissioning | 1975 |
| Rated output | 500 MVA |
| Rated voltage | 24 kV |
| Rated frequency | 60 Hz |
| Type of cooling | $H_2/H_2O$ |

Figure 5:
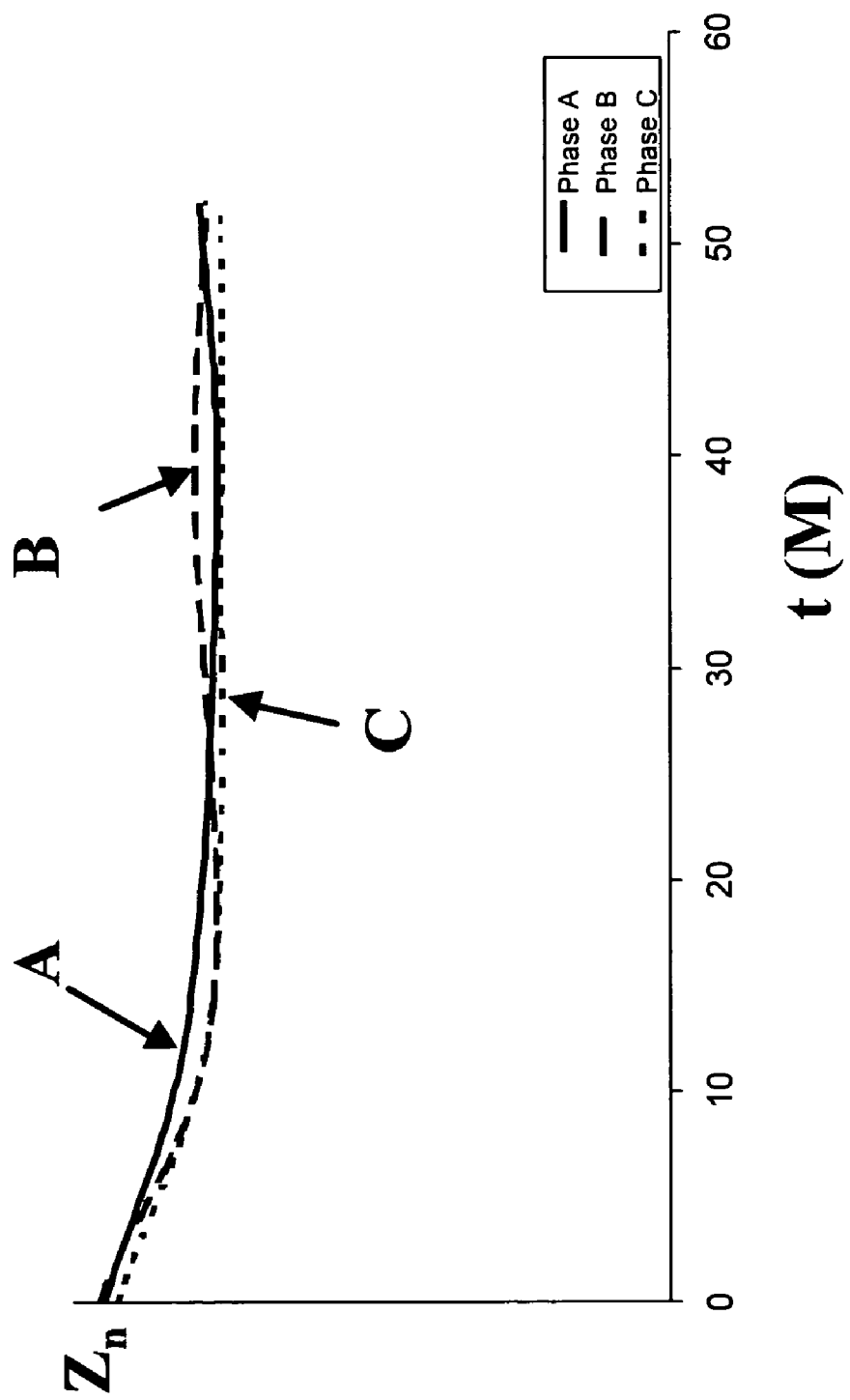
FIG. 5 shows a scaled state parameter as a function of time for the three phases of an electrical operating means, similarity values derived from windows according to FIG. 2 having been used and the phase resolved partial discharge patterns from FIG. 4 being used as a basis.
Figure 6:
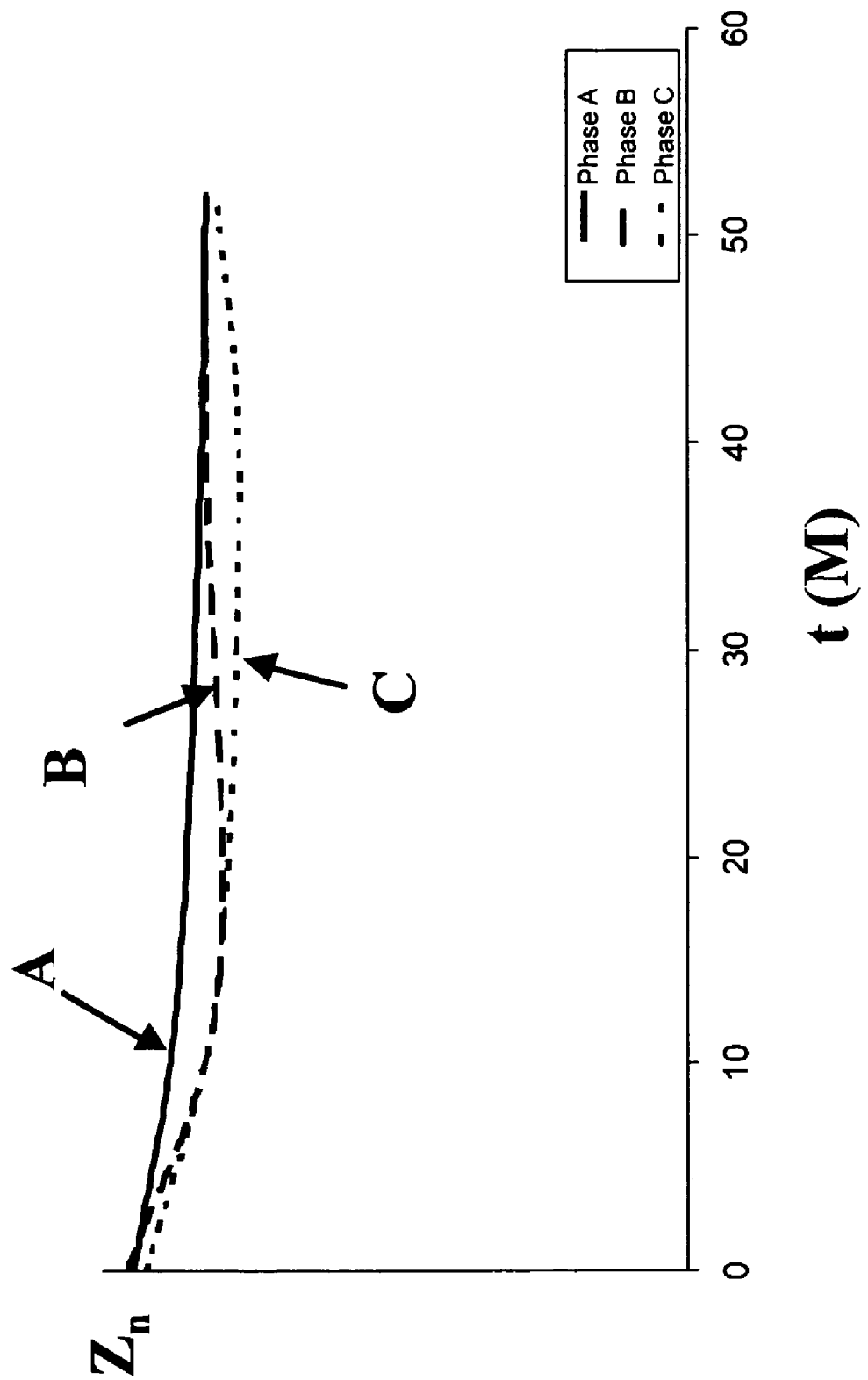
FIG. 6 shows a scaled state parameter as a function of time for the three phases of an electrical operating means, similarity values derived from windows in regions of interest according to FIG. 3 having been used and the phase resolved partial discharge patterns from FIG. 4 being used as a basis.

The partial discharge behavior of all three phases A, B, and C has been recorded regularly over a time period of more than 50 months with electrical sensors, in this case FIG. 4 shows a selection of measured partial discharge patterns, FIG. 5 shows the state parameters $Z_n$ obtained from this over this time period when a method as illustrated in FIG. 2 is used. FIG. 6 shows the state parameters $Z_n$ obtained from this over this time period when a method as illustrated in FIG. 3 is used, the state changes of all the previously marked subregions of interest having been combined to form an overall state parameter and all the regions marked as of interest having been weighted equally.

The partial discharge pattern measured first in each phase has been used to obtain the assessed state parameter, and hereby the state change always relates to this first assessed measurement as a basis.

The change in the partial discharge behavior at around 10 months was documented by means of supplementary diagnostic examinations and also by means of visual findings. The subsequent constant behavior permits the conclusion that the insulation of this electrical operating means will exhibit a stable behavior.

The following should be mentioned as substantial differences from the methods already known (see the "Prior Art" section):
1. The time difference between 2 process states, the state parameters, is represented as a single numerical value or as a set of numerical values. This results in little expenditure for the storage of the similarity value which represents the difference between two process states. Thus, comparisons of the process states are also possible in very short time intervals, since the quantity of data is low.
2. The state of the operating means does not necessarily have to be known at any of the times 2, 3, since only the change over time of the state parameters is registered.
3. Linked with the state parameter(s) assessed at the first time 2, the actual state of the insulation can be estimated. On the basis of the linked values, future states of the insulation can be estimated and, if appropriate, actions can be taken to detect and to avoid critical states.
4. The state change is determined for the operating means with itself. No comparison is carried out with other operating means which could exhibit a similar behavior under certain circumstances. This linking is carried out during the first assessment of the state at a selected time 2.
5. The size, shape and number of subregions 9, 10 of interest can be selected as desired in order to optimize the comparison processes to the partial discharge process on which they are based.
6. The size, shape and number of windows 4 which are written into the subregions 9, 10 of interest (or else into the entire plane), and which describe these subregions mathematically, can be selected as desired in order to optimize the comparison processes to the partial discharge process on which they are based.
7. The assessed state or the assessed states can be obtained at the selected time 2 on the basis of the experience of the "human expert" who carries out this assessment. For this reason, the fundamental "experience base" is arbitrarily large.
8. The "experience base" used as a basis for obtaining the assessed states at the selected time 2 comprises all the fundamental experience relating to partial discharge behavior, design features, typical load behavior, typical fault locations, etc.
9. The size of the windows 4 into which the pictures 1, 2, 3 are subdivided for the comparison (in particular in a method according to FIG. 2) can be selected as desired in order to optimize the comparison process to the process on which it is based.
10. The shape of the windows 4 into which the pictures 1, 2, 3 are subdivided for the comparison (in particular in a method according to FIG. 2) can be selected as desired in order to optimize the comparison process to the process on which it is based.
11. The selection of the regions 9, 10 of interest at the selected time 2 in a method according to FIG. 3 is based on the experience of the "human expert" who carries out the marking of these regions 9 and 10 of interest. For this reason, the fundamental "experience base" is arbitrarily large.
12. In the determination of the similarity values, any desired weighting and scaling in accordance with defined criteria can be introduced (for example weighting of the amplitude 7 or the partial discharge number per pixel 5 or else weighting of the phase angle 6).
13. Each marked subregion 9, 10 can be weighted individually in order to take better account of the actual damaging process.
14. By means of the separate assessment of the change in the state parameters outside the regions 9, 10 identified as of interest and outside the windows 4 describing them mathematically, changes in the partial discharge process are also detected which were not judged to be significant at the (assessed) first time 2 or where no partial discharge processes were detectable.
15. In the method according to FIG. 3, as a result of the separate treatment of identified regions and non-identified regions, no or only little interference signal suppression is needed.

Obviously, numerous modifications and variations of the present invention are possible in light of the above teachings. It is therefore to be understood that, within the scope of the appended claims, the invention may be practiced otherwise than as specifically described herein.

List of Designations

1 Process state matrix, visualized as a picture in pixel representation, for example 256 pixels×256 pixels
2 Process state at the first time, assessed state
3 Process state at the later time
4 Window
5 Matrix element/pixel
5a Matrix element with high frequency of occurrence
5b Matrix element with medium frequency of occurrence
5c Matrix element with low frequency of occurrence
6 Abscissa; x-coordinate (phase angle of the occurrence of the partial discharge)
7 Ordinate; y-coordinate (partial discharge pulse amplitude)
8 Pattern
9 First subprocess of interest, first region of interest (ROI)
10 Second subprocess of interest, second region of interest (ROI)
$Z_n$ State parameter

What is claimed as new and desired to be secured by Letters Patents of the United States is:

1. A method for the analysis, monitoring, or both, of the partial discharge behavior of an electrical operating device, the method comprising:
   recording partial discharge data in process state matrices, the partial discharge data including amplitude of a partial discharge, phase angle of said partial discharge, and frequency of occurrence of said partial discharge, said partial discharge data being depicted in a matrix element of the process state matrix;
   at a first time, registering a partial discharge process state in a first process state matrix;
   at a second time after said first time, registering a second partial discharge process state in a second process state matrix; and
   comparing the first and the second process state matrices, said comparing comprising comparison and scaling;
   for each process state matrix, first determining state parameters ($Z_n$); and
   comparing said state parameters ($Z_n$) for analysis, monitoring, or both, of the states of the insulation of said electrical operating device.

2. The method as claimed in claim 1, further comprising, for each matrix element of the process state matrix, depicting the amplitude of a partial discharge as a function of the phase angle; and
   assigning each matrix element an associated frequency of occurrence.

3. The method as claimed in claim 1, further comprising:
   determining the variation over time of the state parameters ($Z_n$) from process state matrices; and
   assessing the change over time or the prognosis of the further change over time of the partial discharge behavior based on said variation over time of the state parameters ($Z_n$).

4. The method as claimed in claim 1, further comprising:
   weighting, scaling, or both, the individual matrix elements differently, depending on the amplitude, the phase angle, or the frequency of occurrence, before said individual matrix elements are used in comparison and scaling.

5. The method as claimed in claim 1, wherein comparison comprises forming similarity values which reproduce the difference between the process state matrices.

6. The method as claimed in claim 1, further comprising:
   combining matrix elements of the process state matrices in discrete windows; and
   averaging together, scaling together, or both, each of the matrix elements of the process state matrices of a window before using in said comparison.

7. The method as claimed in claim 6, further comprising:
   comparing the contents of corresponding windows of different process state matrices; and
   weighting, scaling, or both, different windows in a process state matrix differently.

8. The method as claimed in claim 5, further comprising:
   combining matrix elements in discrete regions of interest of said process state matrices.

9. The method as claimed in claim 8, further comprising:
   dividing up the discrete regions of interest into discrete windows; and
   treating equally the contents of windows of identical regions in said comparison.

10. The method as claimed in claim 8, further comprising:
    linking state changes obtained from the comparisons of the state parameters obtained from regions of interest to obtain a number of state parameters.

11. The method as claimed in claim 8, further comprising:
    linking state changes obtained from the comparisons of the state parameters obtained from regions of interest with at least one state parameter obtained from regions not of interest, to obtain a number of state parameters.

12. The method as claimed in claim 1, wherein determining state parameters ($Z_n$) comprises determining scaled state parameters ($Z_n$).

13. The method as claimed in claim 5, further comprising:
    visualizing the process state matrices in a representation of the amplitudes as a function of the phase angle, and in an encoding of each such pixel as a function of the frequency of occurrence.

14. The method as claimed in claim 6, further comprising:
    defining the windows in the plane covered by phase angles and amplitudes.

15. The method as claimed in claim 8, further comprising:
    weighting, scaling, or both, different discrete regions of interest differently in said comparison.

16. The method as claimed in claim 15, further comprising:
    defining the regions of interest in the plane covered by phase angles and amplitudes.

17. A method as claimed in claim 1, wherein the analysis, monitoring, or both, of the development of the partial discharge behavior of the electrical operating device is performed over time.

18. A method as claimed in claim 6, wherein combining comprises combining adjacently arranged matrix elements in discrete windows.

19. A method as claimed in claim 8, wherein combining comprises combining adjacently arranged matrix elements in discrete regions of interest.

20. A method as claimed in claim 9, wherein treating equally in said comparison is performed after averaging of the matrix elements of the respective window.

21. A method as claimed in claim 10, wherein said linking comprises mathematical linking.

22. An apparatus for the analysis, monitoring, or both, of the partial discharge behavior of an electrical operating device, the apparatus comprising:

means for recording partial discharge data in process state matrices, the partial discharge data including amplitude of a partial discharge, phase angle of said partial discharge, and frequency of occurrence of said partial discharge, said partial discharge data being depicted in a matrix element of the process state matrix;

means for, at a first time, registering a partial discharge process state in a first process state matrix;

means for, at a second time after said first time, registering a second partial discharge process state in a second process state matrix; and means for comparing the first and the second process state matrices, said means for comparing comprising means for comparison and scaling;

means for determining state parameters ($Z_n$) for each process state matrix; and means for comparing said state parameters ($Z_n$) for analysis, monitoring, or both, of the states of the insulation of said electrical operating device.

* * * * *